(12) United States Patent
Zelsacher

(10) Patent No.: US 6,661,086 B2
(45) Date of Patent: Dec. 9, 2003

(54) THREE-DIMENSIONALLY EMBODIED CIRCUIT WITH ELECTRICALLY CONNECTED SEMICONDUCTOR CHIPS

(75) Inventor: Rudolf Zelsacher, Klagenfurt (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/146,583

(22) Filed: May 15, 2002

(65) Prior Publication Data

US 2002/0163067 A1 Nov. 7, 2002

Related U.S. Application Data

(63) Continuation of application No. PCT/DE00/03980, filed on Nov. 9, 2000.

(30) Foreign Application Priority Data

Nov. 15, 1999 (DE) .......................... 199 54 895

(51) Int. Cl.[7] ............................................... H01L 23/24
(52) U.S. Cl. .................. 257/687; 257/774; 257/777
(58) Field of Search ............................. 257/685, 686, 257/692, 774, 777

(56) References Cited

U.S. PATENT DOCUMENTS

| | | | |
|---|---|---|---|
| 3,904,442 A | 9/1975 | Anthony et al. | |
| 4,275,410 A | * 6/1981 | Grinberg et al. | 257/777 |
| 4,612,083 A | 9/1986 | Yasumoto et al. | |
| 4,760,335 A | 7/1988 | Lindberg | |
| 4,761,681 A | 8/1988 | Reid | |
| 5,386,142 A | * 1/1995 | Kurtz et al. | 257/690 |
| 5,474,458 A | 12/1995 | Vafi et al. | |
| 5,528,080 A | 6/1996 | Goldstein | |
| 5,608,264 A | 3/1997 | Gaul | |
| 5,973,368 A | * 10/1999 | Pearce et al. | 257/368 |

FOREIGN PATENT DOCUMENTS

| | | |
|---|---|---|
| DE | 42 09 072 | 9/1993 |
| EP | 0 722 201 A2 | 7/1996 |

* cited by examiner

Primary Examiner—Nathan J. Flynn
Assistant Examiner—Leonardo Andújar
(74) Attorney, Agent, or Firm—Laurence A. Greenberg; Werner H. Stemer; Gregory L. Mayback

(57) ABSTRACT

The invention relates to a three-dimensional circuit configuration in which semiconductor chips are configured one above the other and in which the semiconductor chips are electrically connected together. In this arrangement, conductive channels are produced between mutually opposite surfaces of the semiconductor chips by thermomigrating a conductive material.

6 Claims, 1 Drawing Sheet

THREE-DIMENSIONALLY EMBODIED CIRCUIT WITH ELECTRICALLY CONNECTED SEMICONDUCTOR CHIPS

CROSS-REFERENCE TO RELATED APPLICATION

This application is a continuation of copending International Application No. PCT/DE00/03980, filed Nov. 9, 2000, which designated the United States and was not published in English.

BACKGROUND OF THE INVENTION

Field of the Invention

The present invention relates to a configuration for electrically connecting semiconductor chips arranged one above the other in a three-dimensionally embodied circuit. The circuit includes interconnects, which are led from one active surface of a semiconductor chip through the semiconductor chip to the other surface, opposite the first active surface of the semiconductor chip. Contact plugs, via which the semiconductor chips are arranged one above the other are electrically connected to one another.

In electronic devices, such as, for example, personal computers (PC), laptops, electronic notebooks, etc., the packing density is intended to be as high as possible through three-dimensional or 3D arrangement of semiconductor chips used in the devices. One example of such a 3D arrangement is the microprocessor semiconductor chip sold under the trademark PENTIUM™, which is provided directly on a 1 gigabit DRAM memory semiconductor chip and which is accommodated together with the DRAM memory semiconductor chip in a common housing.

Previously, the electrical connection between such semiconductor chips has preferably been established by bonding using wires or electrically conductive connections on circuit boards. Both require additional space for routing the bonding wires or for accommodating the circuit boards, so that limits are imposed on an increase in the packing density.

U.S. Pat. No. 5,608,264 describes a surface-mounted integrated circuit in which oxide layers are provided between interconnects and semiconductor chips.

Furthermore, U.S. Pat. No. 5,528,080 discloses a circuit arrangement in which interconnects are produced by a thermomigration of conductive material in a semiconductor body in order to produce electrical connections between mutually opposite surfaces. Similar conductive connections which are produced by thermomigration and form pn junctions are also described in U.S. Pat. No. 3,904,442.

Finally, interconnects produced by thermomigration between different surfaces of a semiconductor body are also disclosed in U.S. Pat. No. 4,761,681 and U.S. Pat. No. 4,612,083.

SUMMARY OF THE INVENTION

It is accordingly an object of the invention to provide a three-dimensionally embodied circuit which overcomes the above-mentioned disadvantages of the prior art apparatus of this general type.

In particular, it is an object of the invention to provide a configuration for electrically connecting semiconductor chips in a three-dimensionally embodied circuit which allows a particularly high packing density to be achieved for the semiconductor chips and which can nevertheless ensure a reliable insulation of interconnects from other zones of the semiconductor chip.

With the foregoing and other objects in view there is provided, in accordance with the invention, a three-dimensionally embodied circuit, that includes a plurality of semiconductor chips configured one above another. The plurality of the semiconductor chips include a first semiconductor chip. The first semiconductor chip has an active first surface, a second surface opposite the active first surface, interconnects running from the active first surface to the second surface, and other zones. Contact plugs electrically connect the plurality of the semiconductor chips together. The first semiconductor chip includes regions surrounding the interconnects. The regions cooperate with the interconnects such that each one of the interconnects is electrically insulated from the other zones of the first semiconductor chip by a pn junction. The regions are formed by a thermomigration of a conductive material.

In accordance with an added feature of the invention, the first semiconductor chip has an n-conducting semiconductor body; and the conductive material is aluminum.

In accordance with an additional feature of the invention, the first semiconductor chip has a p-conducting semiconductor body; and the conductive material is arsenic.

In accordance with another feature of the invention, the contact plugs are provided on the active first surface of the first semiconductor chip.

In accordance with a further feature of the invention, the contact plugs are formed from aluminum.

In accordance with a further added feature of the invention, the first semiconductor chip is composed of silicon.

The object of the invention is achieved by virtue of the fact that the interconnects are surrounded by regions produced by thermomigration of a conductive material and are thereby electrically insulated from other zones of the semiconductor chip by a pn junction.

For the electrical connection of semiconductor chips in a 3D arrangement, it is inherently possible to utilize thermomigration instead of the widened bonding wires or circuit boards. By way of example, aluminum is applied to an n-conducting silicon wafer by vapor deposition and is patterned. A temperature gradient is then produced in the silicon wafer by using a rapid thermal treatment (RTP). The aluminum applied to the silicon wafer then starts to migrate along the temperature gradient in the silicon wafer and forms a highly doped p-conducting region there. Such a region requires a time duration of a few minutes to pass through the silicon wafer, depending on the layer thickness of the silicon wafer.

By utilizing this thermomigration, for example, of aluminum in an n-conducting silicon wafer, it is thus possible to produce vertical conductive interconnects or channels from the active surface of a semiconductor chip embodied in the semiconductor wafer as far as the rear side of the chip.

If n-conducting channels are intended to be produced in a p-conducting silicon wafer, then thermomigration of arsenic may be performed.

Instead of the conductive materials specified namely aluminum and arsenic, it is also possible, if appropriate, to use other substances.

The channels forming interconnects are always produced below pads or contact pads, to be produced later, from one active surface of the semiconductor wafer. These channels or interconnects therefore require no additional area.

In the inventive configuration, then, interconnects are surrounded by regions produced by thermomigration of a conductive material, in order to ensure electrical insulation from other zones of the semiconductor chip by means of the pn junction thereby formed.

A second semiconductor chip that is to be connected to a semiconductor chip acquires plugs on its active surface. These plugs may be composed of aluminum, for example, and the surface of these plugs is provided in a pattern that corresponds to the pattern of the channels on the opposite top side of the first-mentioned semiconductor chip. This second semiconductor chip then has placed on it the first semiconductor chip with its opposite surface, so that the channels which end there make contact with the aluminum plugs.

After the thermomigration, the individual surfaces of the semiconductor wafers forming the semiconductor chips may be subjected to aftertreatment in a customary manner by chemical mechanical polishing or chemical reactions, in order thus to prepare the surfaces for the next steps.

Other features which are considered as characteristic for the invention are set forth in the appended claims. Although the invention is illustrated and described herein as embodied in a configuration for electrically connecting chips in a three-dimensionally embodied circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
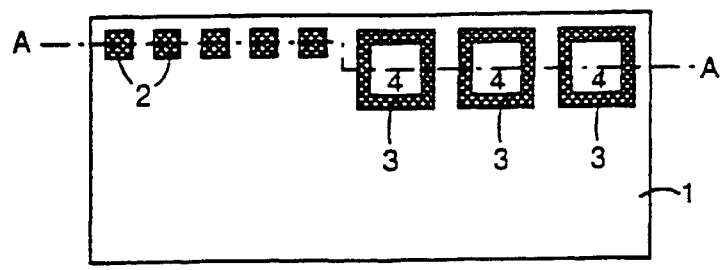
FIG. 1 shows a plan view of a semiconductor chip.
Figure 2:
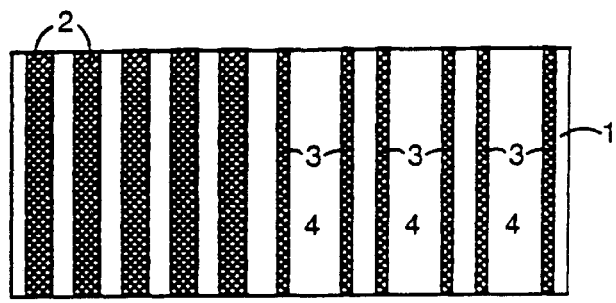
FIG. 2 shows an elevational view of the semiconductor chip shown in FIG. 1.

Referring now to the figures of the drawing in detail and first, particularly, to FIG. 1 thereof, there is shown a plan view of an n-doped silicon chip 1 having a surface to which aluminum has been applied and patterned into a specific pattern. FIG. 2 is an elevational view of the n-doped silicon chip 1. This patterning process is followed by an RTP (Rapid Thermal Processing) process, in the course of which a temperature gradient is produced in the silicon chip 1. The aluminum then propagates along this temperature gradient into the depth of the silicon chip 1 and thus forms pillar-type p-conducting channels of interconnects 2.

According to the invention, it is now possible to configure aluminum in a "frame-type" manner, so that it surrounds an n-conducting region. In this case, the n-conducting region 4 surrounded by the p-conducting region 3 then forms a pillar-type n-conducting channel which is led between the two surfaces of the silicon chip 1. In this case, the n-conducting region 4 is electrically insulated from other zones of the silicon chip 1 by the p-conducting region 3.

If the silicon chip 1 is p-conducting, then n-conducting structures corresponding to the structures of FIGS. 1 and 2 can be produced in the chip by the application and thermomigration of arsenic. The conduction types specified above can thus be respectively reversed, and this also applies to the exemplary embodiments below.

FIG. 2, which shows an elevational view corresponding to the section line AA shown in FIG. 1, reveals that the channels 2 and regions 4 produced by thermomigration run precisely from one surface of the silicon chip 1 to the other surface thereof and take up no additional area on the chip, since they are arranged below corresponding pads. It should be noted that for more clearly illustrating the invention, FIGS. 1–4 show the channels 2 and the frame-type regions 3 in a greatly enlarged manner in comparison with the chip 1.

Figure 3:
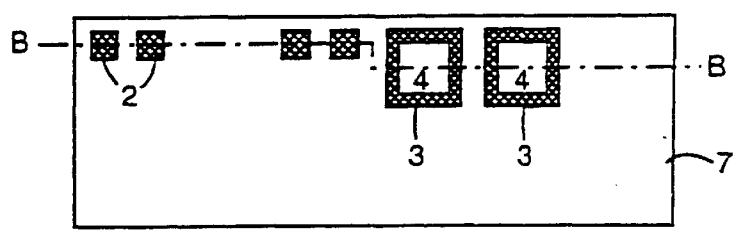
FIG. 3 shows a plan view of a three-dimensional circuit.
Figure 4:
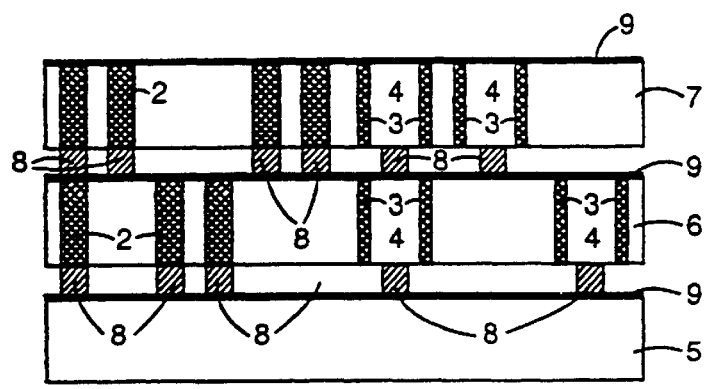
FIG. 4 shows an elevational view of the three-dimensional circuit shown in FIG. 3.

In the exemplary embodiment shown in FIGS. 3 and 4, a 128 megabit EEPROM semiconductor chip 5, a Semiconductor chip 6 sold under the trademark PENTIUM™, and a 1 gigabit DRAM semiconductor chip 7 are provided one above the other. In this case, the Semiconductor chip 6 sold under the trademark PENTIUM™ has, on its top side, contact plugs 8 whose pattern corresponds to the pattern of the channels 2 and conductive regions 4 on the rear side of the DRAM semiconductor chip 7. In a similar manner, on the active top side of the EEPROM semiconductor chip 5, such contact plugs 8 are provided for electrically connecting the rear side of the Semiconductor chip 6 sold under the trademark PENTIUM™. These active top sides of the semiconductor chips 5, 6, 7 are indicated by bar lines 9.

FIG. 4, which shows an elevational view through the section line BB shown in FIG. 3, reveals how the channels or interconnects 2 produced by thermomigration and the regions 4 surrounded by the regions 3 produced by thermomigration establish electrical connections between the semiconductor chips 5, 6 and 7. Contact plugs 8 made of aluminum, for example, are provided between the semiconductor chips 5, 6 and 7 at the corresponding locations. The contact plugs 8 are preferably situated on the active surface 9 of the semiconductor chips 5 and 6 and thus provide for an electrical connection to the active surface of the respective overlying semiconductor chip.

Thermomigration is utilized to produce conductive channels or interconnects through semiconductor chips in order, in this way, to establish electrical connections between individual semiconductor chips in a three-dimensional circuit arrangement using the conductive channels or interconnects.

If the regions 4 are used for the purpose of electrical connection (the regions being arranged in the frame-type regions 3), then these regions 4 must, of course, be doped sufficiently high in order to be able to produce a low-impedance connection between the individual semiconductor chips.

Besides aluminum, it is also possible to choose any other suitable material, such as, for example, gold, etc., for the contact plugs 8.

Figure 5:
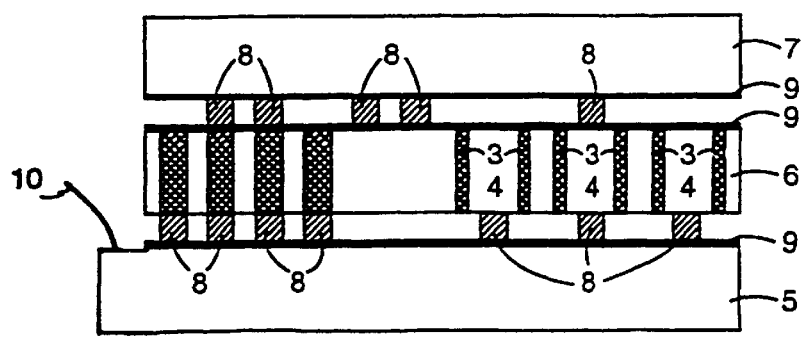
FIG. 5 diagrammatically shows another exemplary embodiment of the three-dimensional circuit.

FIG. 5 shows an exemplary embodiment in which a 128 megabit EEPROM semiconductor chip 5, a Semiconductor chip 6 sold under the trademark PENTIUM™, and a 1 gigabit DRAM semiconductor chip 7 lie one above the other. In this case, the channels 2 and the conductive regions 4 run only in the central chip, namely the Semiconductor chip 6 sold under the trademark PENTIUM™. The top and bottom surfaces of these channels 2 are contact-connected to the respective surface of the other chips 5 and 7, via the contact plugs 8. In this case, the EEPROM semiconductor chip 5 may be provided with bonding wires 10.

FIG. 5 reveals how the channels 2 and regions 4 and the contact plugs 8 allow connections between the individual chips, namely for example (from left to right in this figure) from chip 5 to the active surface 9 of chip 6, from chip 5 to chip 7, from chip 5 to chip 7, from chip 5 to the active surface 9 of chip 6, from chip 6 to chip 7, from chip 6 to chip 7, from chip 5 to the active surface 9 of chip 6, from chip 5 to chip 7 and from chip 5 to the active surface 9 of chip 6.

In the above exemplary embodiments, the semiconductor chip 1 and 5, 6, 7 is in each case composed of silicon. However, the invention is not restricted thereto, but can also be used with semiconductor chips that are fabricated from a material other than silicon, for example from AIII-BV compounds. A suitable conductive material would be introduced into the semiconductor chip, which material establishes the desired conductive channels or interconnects by thermomigration.

I claim:

1. A three-dimensionally embodied circuit, comprising:

a plurality of semiconductor chips configured one above another, said plurality of said semiconductor chips including a first semiconductor chip, said first semiconductor chip having a conductivity type, an active first surface, a second surface opposite said active first surface, interconnects running from said active first surface to said second surface, and other zones; and contact plugs electrically connecting said plurality of said semiconductor chips together;

said first semiconductor chip including regions surrounding said interconnects, said regions having a conductivity type opposing said conductivity type of said first semiconductor chip;

said regions cooperating with said interconnects such that each one of said interconnects is electrically insulated from said other zones of said first semiconductor chip by a pn junction; and said regions formed by a thermomigration of a conductive material.

2. The circuit according to claim 1, wherein:

said first semiconductor chip has an n-conducting semiconductor body; and said conductive material is aluminum.

3. The circuit according to claim 1, wherein:

said first semiconductor chip has a p-conducting semiconductor body; and said conductive material is arsenic.

4. The circuit according to claim 1, wherein: said contact plugs are provided on said active first surface of said first semiconductor chip.

5. The circuit according to claim 1, wherein: said contact plugs are formed from aluminum.

6. The circuit according to claim 1, wherein: said first semiconductor chip is composed of silicon.

* * * * *